United States Patent
Herner et al.

(10) Patent No.: US 7,224,013 B2
(45) Date of Patent: May 29, 2007

(54) JUNCTION DIODE COMPRISING VARYING SEMICONDUCTOR COMPOSITIONS

(75) Inventors: S. Brad Herner, San Jose, CA (US); Andrew J. Walker, Mountain View, CA (US)

(73) Assignee: Sandisk 3D LLC, Milpitas, CA (US)

( * ) Notice: Subject to any disclaimer, the term of this patent is extended or adjusted under 35 U.S.C. 154(b) by 295 days.

(21) Appl. No.: 10/954,577

(22) Filed: Sep. 29, 2004

(65) Prior Publication Data

US 2006/0073657 A1 Apr. 6, 2006

(51) Int. Cl.
*H01L 27/108* (2006.01)
*H01L 21/82* (2006.01)

(52) U.S. Cl. .................. 257/296; 257/208; 438/128

(58) Field of Classification Search ............... 438/237, 438/100, 101, 128, 130, 131; 257/458, 457, 257/443, 431, 208, 209, 296
See application file for complete search history.

(56) References Cited

U.S. PATENT DOCUMENTS 6,879,014 B2 * 4/2005 Wagner et al. .............. 257/458

6,951,780 B1 * 10/2005 Herner ........................ 438/128
2003/0164491 A1 9/2003 Lee

OTHER PUBLICATIONS

Bang, David.S. ,et al. ,"Resistivity of boron and phosphorus doped polycrystalline Si1-xGex films",*Appl. Phys. Lett. 66* (2) Jan. 9, 1995, 195-197.
King, Tsu-Jae.,et al. ,"Polycrystalline Silicon-Germanium Thin-Film Transistors", *IEEE Transactions on Electron Devices*, vol. 41, No. 9, Sep. 1994, 1581-1591.

* cited by examiner

*Primary Examiner*—Kevin M. Picardat
(74) *Attorney, Agent, or Firm*—Vierra Magen Marcus & DeNiro LLP

(57) ABSTRACT

The invention provides for a junction diode including a heavily doped first region having a first conductivity type, a second lightly doped or intrinsic region having a second conductivity type, and a third heavily doped region having a second conductivity type. The junction diode comprises more than one semiconductor or semiconductor alloy. In preferred embodiments, the lightly doped or intrinsic region has a higher proportion of germanium than on or the other or both of the heavily doped regions. In preferred embodiments, the junction diode is vertically oriented, and the top region has a higher proportion of silicon than the other regions.

88 Claims, 5 Drawing Sheets

JUNCTION DIODE COMPRISING VARYING SEMICONDUCTOR COMPOSITIONS

RELATED APPLICATIONS

This application is related to Herner et al., U.S. application Ser. No. 10/954,510, "Memory Cell Comprising a Semiconductor Junction Diode Crystallized Adjacent to a Silicide," hereinafter the '510 application; to Herner et al., U.S. application Ser. No. 10/955,549, "Nonvolatile Memory Cell Without a Dielectric Antifuse Having High- and Low-Impedance States," hereinafter the '549 application; and to Petti et al., U.S. application Ser. No. 10/955,387, "Fuse Memory Cell Comprising a Diode, the Diode Serving as the Fuse Element," all assigned to the assignee of the present invention, all filed on even date herewith and all hereby incorporated by reference in their entirety.

BACKGROUND OF THE INVENTION

The invention relates to a junction diode comprising different semiconductor materials or semiconductor alloys in different parts of the diode.

Some devices, as in Herner et al., U.S. patent application Ser. No. 10/326,470, "An Improved Method for Making High Density Nonvolatile Memory," filed Dec. 19, 2002, hereinafter the '470 application, which is hereby incorporated by reference, employ a vertically oriented semiconductor junction diode. Dopant types and levels are varied throughout the diode, but the entire diode is formed of a single semiconductor or semiconductor alloy.

The present application pursues other ways to vary composition of a junction diode to improve device performance.

SUMMARY OF THE PREFERRED EMBODIMENTS

The present invention is defined by the following claims, and nothing in this section should be taken as a limitation on those claims. In general, the invention is directed to a junction diode formed having different semiconductor composition in different parts of the diode.

A first aspect of the invention provides for a memory cell comprising a semiconductor pillar, the pillar comprising a heavily doped bottom region of a first conductivity type; a heavily doped top region of a second conductivity type; and a lightly doped or intrinsic middle region interposed between and contacting the top and bottom regions, wherein the middle region comprises a first proportion of germanium and either the top region or the bottom region comprises no germanium or comprises a second proportion of germanium less then the first proportion.

A related aspect of the invention provides for a memory cell comprising a) a first conductor extending in a first direction; b) a second conductor extending in a second direction different from the first direction; and c) a semiconductor pillar vertically disposed between the first conductor and the second conductor, the pillar comprising: i) a bottom heavily doped region of a first conductivity type; ii) a top heavily doped region of a second conductivity type; and iii) a middle intrinsic or lightly doped region interposed between and in contact with the top and bottom regions, wherein the top region comprises a first proportion of silicon and the middle region or bottom region comprises either no silicon or a second proportion of silicon less then the first proportion.

Another aspect of the invention provides for a method for forming a monolithic three dimensional memory array, the method comprising a) forming semiconductor pillars, the pillars comprising silicon and germanium, each pillar comprising: i) a first heavily doped region having a first ratio of silicon to germanium; ii) a second region above the first heavily doped region having a second ratio of silicon to germanium; and iii) a third heavily doped region above the second region having a third ratio of silicon to germanium; and b) forming dielectric rupture antifuses above the semiconductor pillars, wherein the first, second and third ratios are not all the same.

A preferred embodiment of the invention provides for a method for forming a memory cell, the method comprising forming a first heavily doped semiconductor region; forming a second lightly doped or intrinsic semiconductor region on and in contact with the first semiconductor region; and forming a third heavily doped semiconductor region on and in contact with the second semiconductor region, wherein all three regions are polycrystalline or amorphous, and wherein the second region comprises a higher proportion of germanium than the first region.

Another aspect of the invention provides for a method for forming a monolithic three dimensional memory array, the method comprising a) forming substantially parallel first conductors extending in a first direction; b) forming first semiconductor pillars by i) depositing silicon by flowing a first source gas comprising silicon for a first time period; ii) depositing germanium by flowing a second source gas comprising germanium for a second time period, wherein the first and second time periods overlap, and wherein, during at least a portion of the depositing steps, the flow of the first source gas is steadily increased or steadily decreased relative to the flow of the second source gas or the flow of the second source gas is steadily increased or decreased relative to the flow of the first source gas; and iii) patterning and etching the deposited silicon and germanium to form the semiconductor pillars.

Yet another aspect of the invention provides for a memory cell comprising a semiconductor pillar, the pillar comprising a heavily doped bottom region of a first conductivity type; a heavily doped top region of a second conductivity type; and a lightly doped intrinsic middle region interposed between and contacting the top and bottom regions, wherein the middle region comprises a first proportion of germanium and the top region or bottom region either comprises no germanium or comprises a second proportion of germanium less then the first proportion.

A related aspect of the invention provides for a memory cell comprising a bottom conductor extending in a first direction; a polycrystalline or amorphous semiconductor junction diode over the bottom conductor, the junction diode comprising silicon and germanium, wherein the silicon:germanium ratio is not constant throughout the junction diode; a top conductor over the junction diode, the top conductor extending in a second direction different from the first direction; and a dielectric rupture antifuse layer in contact with the bottom conductor or the top conductor.

A preferred embodiment of the invention provides for a memory cell comprising a semiconductor pillar, the pillar comprising a heavily doped bottom region of a first conductivity type; a heavily doped top region of a second conductivity type; a lightly doped or intrinsic middle region interposed between and contacting the top and bottom regions; and a dielectric rupture antifuse layer in contact with and above the top region or in contact with and below the bottom region; wherein the middle region comprises a first proportion of germanium and the top region or bottom region either comprises no germanium or comprises a second proportion of germanium less then the first proportion.

Each of the aspects and embodiments of the invention described herein can be used alone or in combination with one another.

The preferred aspects and embodiments will now be described with reference to the attached drawings.

DETAILED DESCRIPTION OF THE INVENTION

A semiconductor junction diode, for example a p-n diode or a p-i-n diode, has been paired with a dielectric antifuse layer to form a memory cell, for example in the monolithic three dimensional memory array described in the '470 application.

The term junction diode is used herein to refer to a semiconductor device with the property of conducting current more easily in one direction than the other, having two terminal electrodes, and made of semiconducting material which is p-type at one electrode and n-type at the other. Examples include p-n diodes and n-p diodes, which have p-type semiconductor material and n-type semiconductor material in contact, and p-i-n and n-i-p diodes, in which intrinsic (undoped) semiconductor material is interposed between p-type semiconductor material and n-type semiconductor material.

Figure 1:
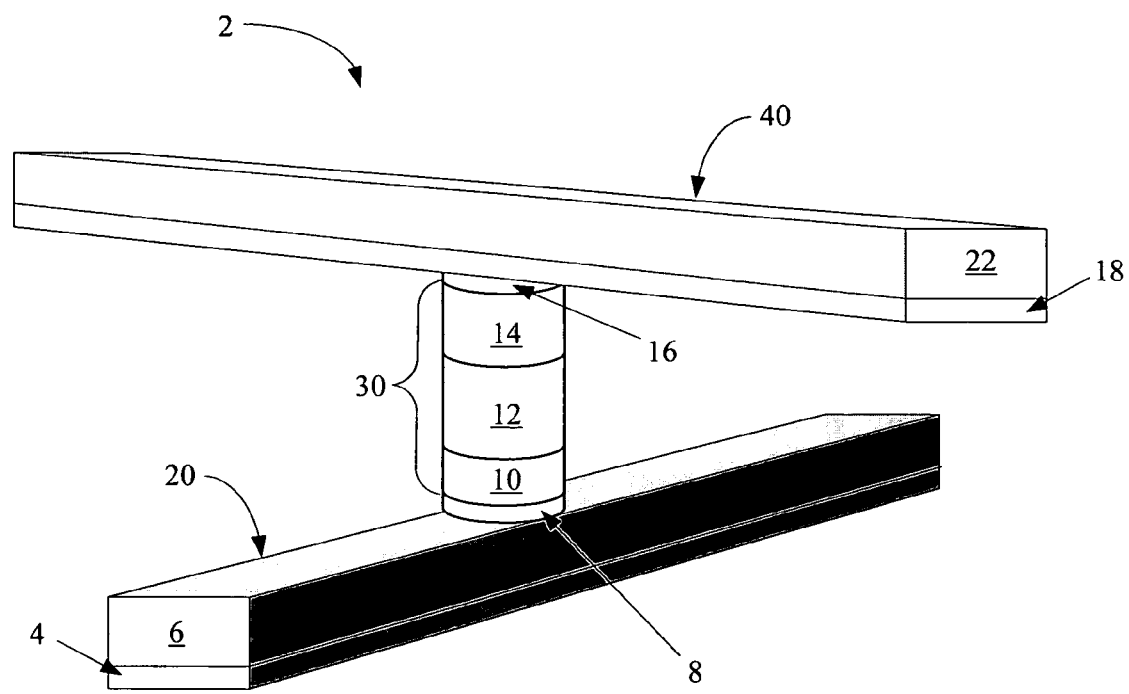
FIG. 1 is a perspective view of a memory cell comprising a vertically oriented junction diode disposed between top and bottom conductors.

A preferred memory cell of the '470 application includes a vertically oriented junction diode disposed between conductors, the cell further having a dielectric antifuse layer interposed between the junction diode and one of the conductors. A memory cell 2 according to the '470 application is shown in FIG. 1. A first conductor 20 preferably comprises titanium nitride layer 4 and tungsten layer 6. Junction diode 30 is formed on optional titanium nitride barrier layer 8 and comprises heavily doped semiconductor layer 10 of a first conductivity type, layer 12 which is undoped semiconductor material or lightly doped semiconductor material of a second conductivity type, and heavily doped semiconductor layer 14 of the second conductivity type. A thin silicon dioxide antifuse layer 16 is formed on top of the junction diode 30. Second conductor 40 preferably comprises titanium nitride layer 18 and tungsten layer 22.

The memory cell 2 is unprogrammed when antifuse layer 16 is intact. To program the cell, a voltage sufficient to cause breakdown of the antifuse material is applied across antifuse layer 16. It is advantageous to maximize the difference in current between an unprogrammed cell and a programmed cell.

The present invention improves current after programming, called forward current, in such a cell by using different semiconductor materials or alloys in different parts of the diode. Use of different semiconductor materials or alloys may also decrease overall processing temperatures.

In general, the diodes of the '470 application may take one of four basic configurations. The top and bottom regions are always heavily doped and have opposite conductivity types: either the bottom region is N+ and the top region is P+ or the bottom region is P+ and the top region is N+. These heavily doped regions provide good ohmic contact to the adjacent conductors.

The middle lightly doped or intrinsic region is interposed between and in contact with the top and bottom heavily doped regions. Even when this region is deposited with no intentional doping, it will always behave as though it is slightly n- or p-type, possibly due to contaminants or defects.

Figure 2A:
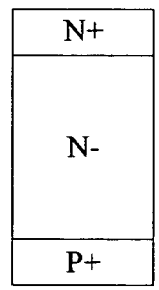
FIGS. 2a-2d are cross-sectional views of possible electrical configurations for junction diodes.
Figure 2B:
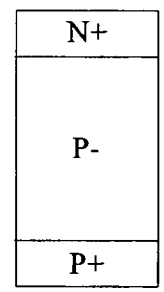
Figure 2C:
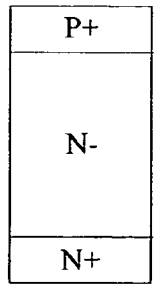
Figure 2D:
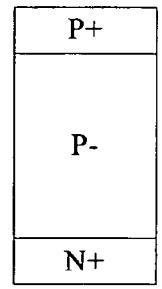

Thus the four electrical configurations as determined by dopant types and concentrations are: P+ at the bottom, N– in the middle, N+ at the top (shown in FIG. 2a); P+ at the bottom, P– in the middle, N+ at the top (shown in FIG. 2b); N+ at the bottom, N– in the middle, P+ at the top (shown in FIG. 2c); and N+ at the bottom, P– in the middle, P+ at the top (shown in FIG. 2d).

Variations of the same diode are described in the '470 application and in Petti et al., U.S. patent application Ser. No. 10/728,230, "Semiconductor Device Including Junction Diode Contacting Contact-Antifuse Unit Comprising Silicide, hereinafter the '230 application, hereby incorporated by reference. Varied terminology is used in the '470 application and the '230 application: A diode which is P+ at the bottom, N– in the middle, and N+ at the top may be described either as a P+N– diode having an N+ ohmic contact or as a p-i-n diode (the N– portion having been deposited with no intentional doping.) The diodes are the same, and the difference is purely semantic. The term "junction diode" is intended to be inclusive.

In most embodiments of the '470 and '230 applications, silicon is used to form all three regions. Other semiconductor materials, for example germanium or a silicon-germanium alloy are taught as well, in each case forming all three regions of the diode. Carrier mobility is higher in germanium; thus forward current is higher for the same potential when germanium or a germanium alloy is used.

Silicon and germanium are fully miscible and can be blended in any proportion. Conductivity characteristics of the resulting alloy tend to be between those of pure silicon and pure germanium; thus a $Si_{0.8}Ge_{0.2}$ alloy, which is 80 atomic percent (at %) silicon and 20 at % Ge will have somewhat higher carrier mobility than pure silicon. Increasing germanium content to, for example, $Si_{0.5}Ge_{0.5}$ will improve carrier mobility further, while still not reaching that of pure germanium. (It will be understood that when this description speaks of "pure silicon" it is intended to describe silicon with substantially no germanium or other semiconductor material added. The word "pure" does not exclude the presence of dopant atoms or other contaminants which may typically occur in a production environment.)

There are disadvantages to the use of germanium, however, which have caused silicon to become adopted as the standard material in the semiconductor industry despite the higher carrier mobility of germanium.

Silicon oxide, which can easily be grown on silicon, is a high quality oxide, suitable for use as a gate oxide (in transistors, for example), an insulating layer, or as a dielectric rupture antifuse layer, as in the '470 application. Germanium oxide is lower quality oxide, though it may still be used as an antifuse.

Figure 3:
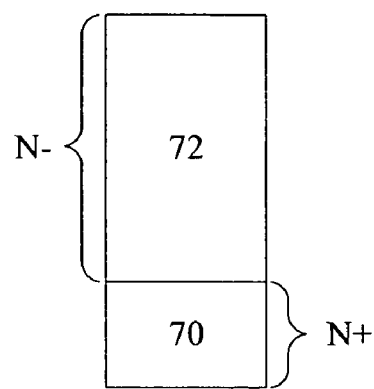
FIG. 3 is a cross-sectional view of portions of a junction diode.

N– and p-type dopants are typically added to semiconductors used in semiconductor devices to increase the conductivity of the semiconductor. An additional difficulty in the use of germanium is that n-type dopants (phosphorus, for example) diffuse very quickly in germanium. Turning to FIG. 3, if a diode is formed in germanium having a heavily doped n-type region 70 adjacent to a region 72 with a different dopant concentration, for example a lightly doped or intrinsic region, there is danger that subsequent exposure to high temperature will cause the dopants in heavily doped region 70 to diffuse into lightly doped region 72, effectively erasing the doping differences and ruining the device.

In the present invention, then, different proportions of silicon and germanium are used in different parts of the diode to optimize for dopant diffusion, device performance, and oxide growth. Specifically, in preferred embodiments, the central lightly doped or intrinsic region of the junction diode has a higher proportion of germanium than either or both of the heavily doped regions. In related embodiments, the top heavily doped region of the junction diode has a higher proportion of silicon than the bottom heavily doped region and the middle lightly doped or intrinsic region.

Examples will be given of several embodiments of the present invention. Detailed information regarding materials, process steps and dimensions will be provided, but it will be apparent to those skilled in the art that many of these details can be modified, added, or omitted while the result falls within the scope of the invention.

Some of the methods and details described here by way of illustration are described more fully in the '470 application. For simplicity, not all of the details of the '470 application are reproduced in this description, but none of the teaching of the '470 application is intended to be excluded.

Figure 4A:
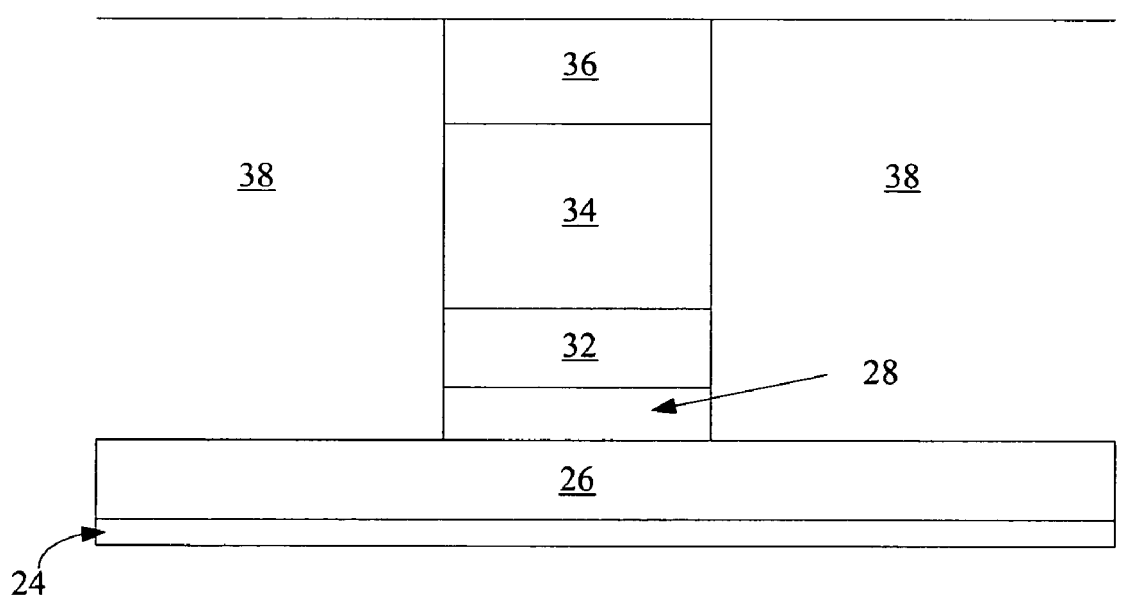
FIGS. 4a and 4b are cross-sectional views illustration formation of a memory cell according to the present invention.

Turning to FIG. 4a, formation of a memory level begins as in the '470 application. Fabrication begins on a suitable substrate (a monocrystalline silicon substrate, for example); typically a dielectric layer is formed over the substrate. The substrate and dielectric layer are not shown. Layers of titanium nitride 24 and tungsten 26 are deposited, then patterned and etched to form substantially parallel conductors, shown extending across the page. Dielectric fill (not shown) is deposited between and over the conductors, then planarized, for example by chemical-mechanical polishing (CMP) or etchback to expose the tungsten 26 of the conductors.

A thin barrier layer 28, preferably of titanium nitride, is optionally formed next on the conductors and fill. This barrier layer prevents reaction between the tungsten of the conductors and the semiconductor to be deposited above it.

Next semiconductor material is deposited which will eventually form vertically oriented pillar shaped diodes. As noted earlier, this diode may take one of four electrical configurations. For simplicity, this description will discuss just one: P+ on the bottom, N– in the middle, N+ on top. It will be understood that any of the four electrical configurations can be made by choosing appropriate dopant types and concentrations.

In the '470 and '230 applications, the pillars are formed entirely of silicon, entirely of germanium, or entirely of a silicon-germanium alloy. In contrast, in the present application, the semiconductor material content will vary in different parts of the pillar.

In this discussion, polycrystalline silicon will be referred to as polysilicon, and polycrystalline germanium will be referred to as polygermanium. In this example, a first layer 32 of about 400 angstroms of in-situ doped polysilicon doped with boron is deposited to form a p-type polysilicon layer. This first layer 32 is preferably heavily doped, i.e. with a dopant concentration of about $1 \times 10^{19}$ to about $2 \times 10^{21}$ atoms/cm$^3$, preferably about $8 \times 10^{20}$ atoms/cm$^3$. Any conventional source gas can be flowed to provide the silicon atoms, for example $SiH_4$, $Si_2H_6$, or dichlorosilane.

Next about 2500 angstroms of intrinsic or lightly doped germanium is deposited to form layer 34. This middle region of the diode should be slightly n-type. Depending on the conditions of its formation, defects present in undoped or intrinsic polygermanium may cause it to behave as though slightly n-type. If necessary, this region can be lightly doped with n-type dopants. The germanium may be either amorphous or polycrystalline as deposited. If it is amorphous, it will be crystallized by a subsequent crystallizing anneal. Any conventional source gas can be flowed to provide the germanium atoms, for example $GeH_4$.

Finally a layer 36 about 800 angstroms of undoped silicon is deposited on germanium layer 34. Up to about 600 angstroms of silicon will be removed by a subsequent planarization step, leaving about 200 angstroms of silicon. Under conventional deposition conditions, this silicon layer will be amorphous as deposited, and will be crystallized by subsequent thermal processing or by a crystallizing anneal.

The result is a silicon-germanium-silicon stack. This stack (layers 36, 34, and 32) is patterned and etched using conventional photolithography and etch techniques to form a plurality of evenly spaced substantially vertical pillars separated by gaps. Each pillar is disposed substantially on an underlying conductor. Some misalignment can be tolerated. Germanium can be etched using the same etchants typically used to etch silicon.

The gaps between the pillars are filled with a dielectric material 38 deposited between and over the pillars. Planarization, for example by CMP or etchback, is performed to expose the tops of the pillars. Ion implantation with n-type dopants is performed after planarization to heavily dope the silicon at the top of the pillar, creating heavily doped region 36 about 200 to about 400 angstroms thick. In other embodiments, the top region of the pillar could have been in situ doped with n-type dopants during deposition instead of being doped by implantation.

In the '470 application the next step is formation of a dielectric rupture antifuse layer on each pillar by oxidation of the semiconductor material at the top of the pillar. If an antifuse is to be formed, it should be formed at this point, preferably by oxidation at 650 degrees C. for one minute. Alternatively, the dielectric rupture antifuse layer can be a grown silicon nitride or silicon oxynitride layer.

However, as described in the '549 application, the semiconductor diodes just described will be formed in an initial high-impedance state. When exposed to a programming voltage, the diodes are converted to a low-impedance state. It is believed that the low-impedance state is achieved by formation of a fused filament traversing the length of the semiconductor pillar.

Thus the diode is not substantially conductive as formed, and formation of a dielectric rupture antifuse layer, as described in the '470 application, is optional. Application of a programming voltage will cause dielectric rupture of the antifuse layer, if present, and will convert the semiconductor diode to a low-impedance state.

Figure 4B:
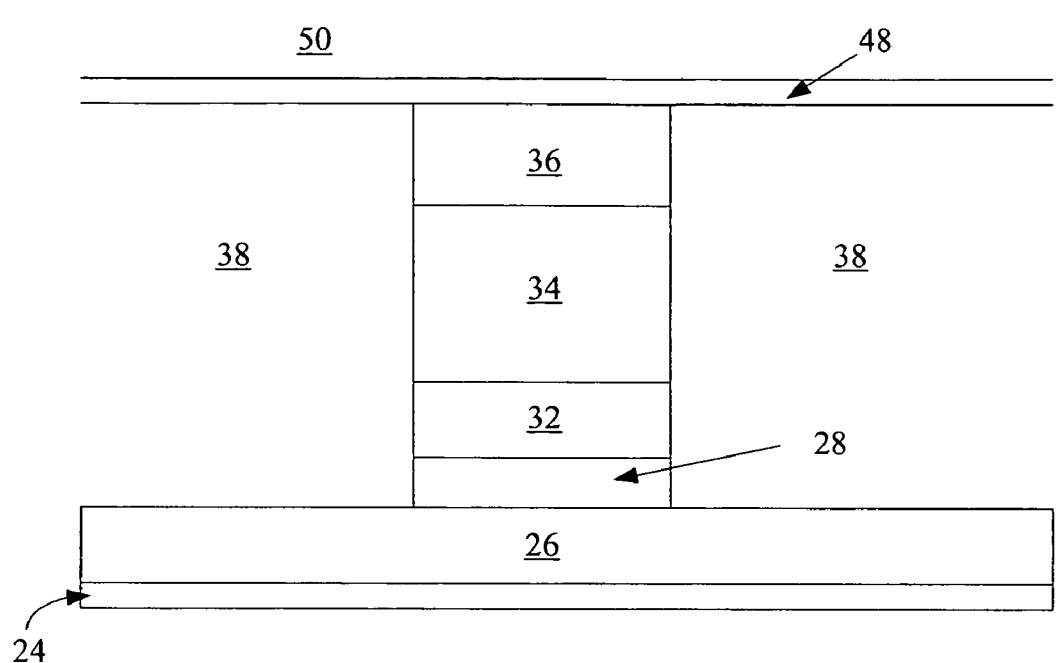

Formation of the overlying conductors proceeds as in the '470 application. Continuing to FIG. 4b, an adhesion layer 48 is deposited, preferably 200 angstroms of conductive material, preferably titanium nitride. Tantalum nitride, tungsten nitride, tantalum, or titanium tungsten can be substituted for titanium nitride. In FIG. 4b, the optional dielectric rupture antifuse layer is not shown.

About 1700 angstroms of tungsten 50 is deposited on the titanium nitride layer, then the tungsten and titanium nitride layers are patterned and etched to form substantially parallel evenly spaced second conductors. The second conductors are preferably substantially perpendicular to the first conductors. The junction diode is preferably aligned at the intersection of the vertical projections of the first conductor below it and the second conductor above it, but some misalignment can be tolerated.

The first (bottom) conductors, junction diodes, and second (top) conductors form a first memory level. As in the '470 application, another memory level can be monolithically formed above this first memory level. A second level of junction diodes can be formed on the second conductors, for example. Third conductors can be formed above the second level of junction diodes to complete a second memory level. The third conductors will preferably extend in substantially the same direction as the first conductors. The second conductors act as the top conductors of the first memory level and the bottom conductors of the second memory level. As in the '470 and '230 applications, fabrication can to form additional memory levels.

Alternatively, in other embodiments, conductors may not be shared, and an interlevel dielectric may separate adjacent memory levels.

The junction diode just described is optimized to use the properties of germanium and silicon to best advantage. As described, n-type dopants diffuse very quickly in germanium. In this junction diode, the heavily n-doped region is silicon rather than germanium, so that dopant diffusion proceeds more slowly.

As noted, carrier mobility is higher in germanium than in pure silicon; this junction diode uses germanium in the lightly doped or intrinsic middle region where a boost in carrier mobility will be expected to offer the most benefit.

High quality dielectrics such as silicon dioxide can be grown on silicon, in contrast to the lower quality germanium oxide that can be grown on germanium. The top region of the junction diode just described is silicon. Thus if an antifuse is formed, it will be an oxide, nitride, or oxynitride of silicon. In this example the top region was entirely silicon. It is believed, however, that it is possible to grow an acceptable dielectric on alloys that are predominantly silicon, for example 95, 90, 80, or 75 atomic percent silicon.

It has been found that P-type dopants may be less soluble in germanium than in silicon. If this is the case in present embodiments, the fact that the bottom heavily doped p-type region is silicon rather than germanium would allow the dopant to be more effective.

Introducing germanium provides an additional advantage. In general, p-type dopants enhance crystallization. Thus at usual deposition temperatures, in situ doped p-type silicon tends to be polycrystalline as deposited, while n-type silicon or undoped silicon is generally amorphous and requires a subsequent anneal to complete crystallization. An all-silicon diode like that described in most embodiments of the '470 application, for example, may require a crystallizing anneal of about 750 degrees performed for one minute.

This high temperature anneal can have unfortunate side effects, including unwanted dopant diffusion and peeling of, for example, metal or silicon dioxide layers or elements caused by differential expansion and contraction of unlike materials when heated and cooled. Germanium, however, acts as a catalyst to crystallization. A germanium or a silicon-germanium alloy region will crystallize at a lower temperature than will a silicon-only region. In addition, a silicon-only region will crystallize at lower temperature if it is in contact with germanium or a germanium alloy; the adjacent germanium provides a crystallization template. Thus use of germanium anywhere in the diode serves to decrease the overall thermal budget.

To summarize, a memory cell formed according to the present invention may comprise a semiconductor pillar, the pillar comprising a heavily doped bottom region of a first conductivity type; a heavily doped top region of a second conductivity type; and a lightly doped or intrinsic middle region interposed between and contacting the top and bottom regions, wherein the middle region comprises a first proportion of germanium (possibly all germanium) and either the top region or the bottom region comprises no germanium or comprises a second proportion of germanium less then the first proportion.

The detailed description just provided taught a vertical semiconductor diode having three regions: a bottom heavily doped p-type region made of silicon, a middle lightly doped or intrinsic region that behaves as if slightly n-doped made of germanium, and a top heavily doped n-type region made of silicon.

As already described, this P+N−N+ diode is only one of four possible electrical configurations defined by dopant type and level.

Many other configurations and blends of semiconductor material across the diode are also possible and fall within the scope of the invention.

Figure 5A:
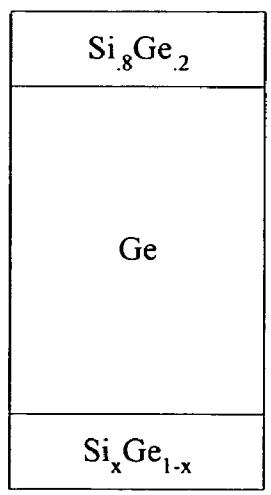
FIGS. 5a-5f are cross-sectional views of junction diodes formed according to preferred embodiments of the present invention.
Figure 5B:
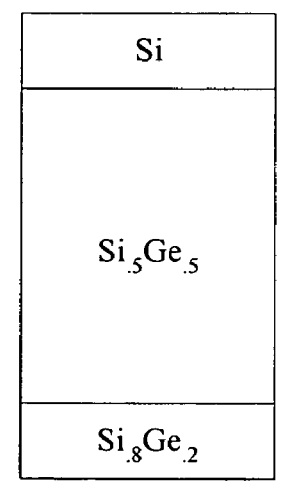
Figure 5C:
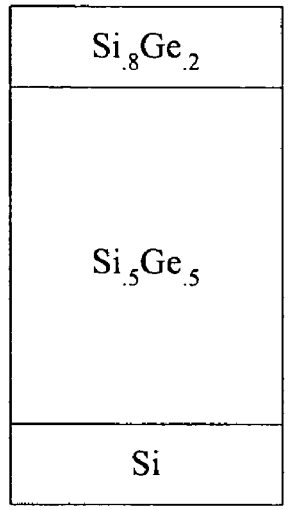
Figure 5D:
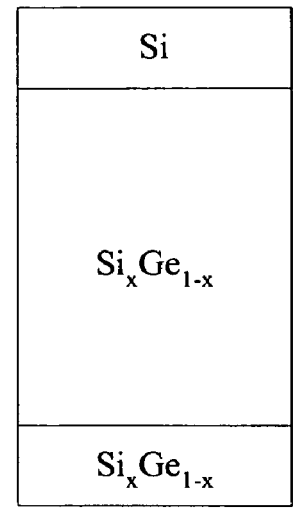
Figure 5E:
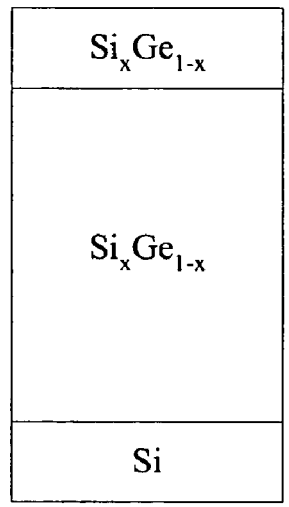

Turning to FIGS. 5a-5f, a series of preferred embodiments is illustrated. In FIG. 5a, the bottom heavily doped region is $Si_xGe_{1-x}$ where $1>x>0$, the middle lightly doped or intrinsic region is germanium, and the top heavily doped region is $Si_{0.8}Ge_{0.2}$. In FIG. 5b, the bottom heavily doped region is $Si_{0.8}Ge_{0.2}$, the middle lightly doped or intrinsic region is $Si_{0.5}Ge_{0.5}$, and the top heavily doped region is silicon. In FIG. 5c, the bottom heavily doped region is silicon, the middle lightly doped or intrinsic region is $Si_{0.5}Ge_{0.5}$, and the top heavily doped region is $Si_{0.8}Ge_{0.2}$. In FIG. 5d, the bottom heavily doped region and the middle lightly doped or intrinsic region are $Si_xGe_{1-x}$ where $1>x>0$ and the top heavily doped region is silicon. In FIG. 5e, the bottom heavily doped region is silicon, and the middle lightly doped or intrinsic region and the top region are $Si_xGe_{1-x}$ where $1>x>0$. Any of these semiconductor compositions can be combined with any of the dopant configurations (P+N−N+, P+P−N+, etc.) mentioned earlier.

In general, it will be seen that the proportion of germanium in the middle region is higher than the proportion of germanium in either the top region, the bottom region or both. This allows higher carrier mobility in the lightly doped or intrinsic region, where the most benefit will occur. Alternatively, in general the proportion of silicon is higher in the top region than in either the bottom or the middle region. A lower proportion of germanium in the top region allows for growth of an oxide containing a higher proportion of silicon oxide than germanium oxide, producing a higher quality oxide antifuse. Thus preferred embodiments of the present invention provide for a memory cell comprising a semiconductor pillar, the pillar comprising a heavily doped bottom region of a first conductivity type; a heavily doped top region of a second conductivity type; and a lightly doped or intrinsic middle region interposed between and contacting the top and bottom regions, wherein the middle region comprises a first proportion of germanium and the top region or bottom region either comprises no germanium or comprises a second proportion of germanium less then the first proportion.

It has been described that higher silicon content in the top region of the junction diode allows for growth of a higher quality oxide antifuse. In embodiments in which no antifuse is to be grown, or in which the antifuse is deposited or formed below the junction diode in contact with the bottom conductor, this advantage becomes less important. In preferred embodiments of the '230 application, for example, an antifuse is formed disposed between the bottom conductor and the bottom region of the junction antifuse.

Figure 5F:
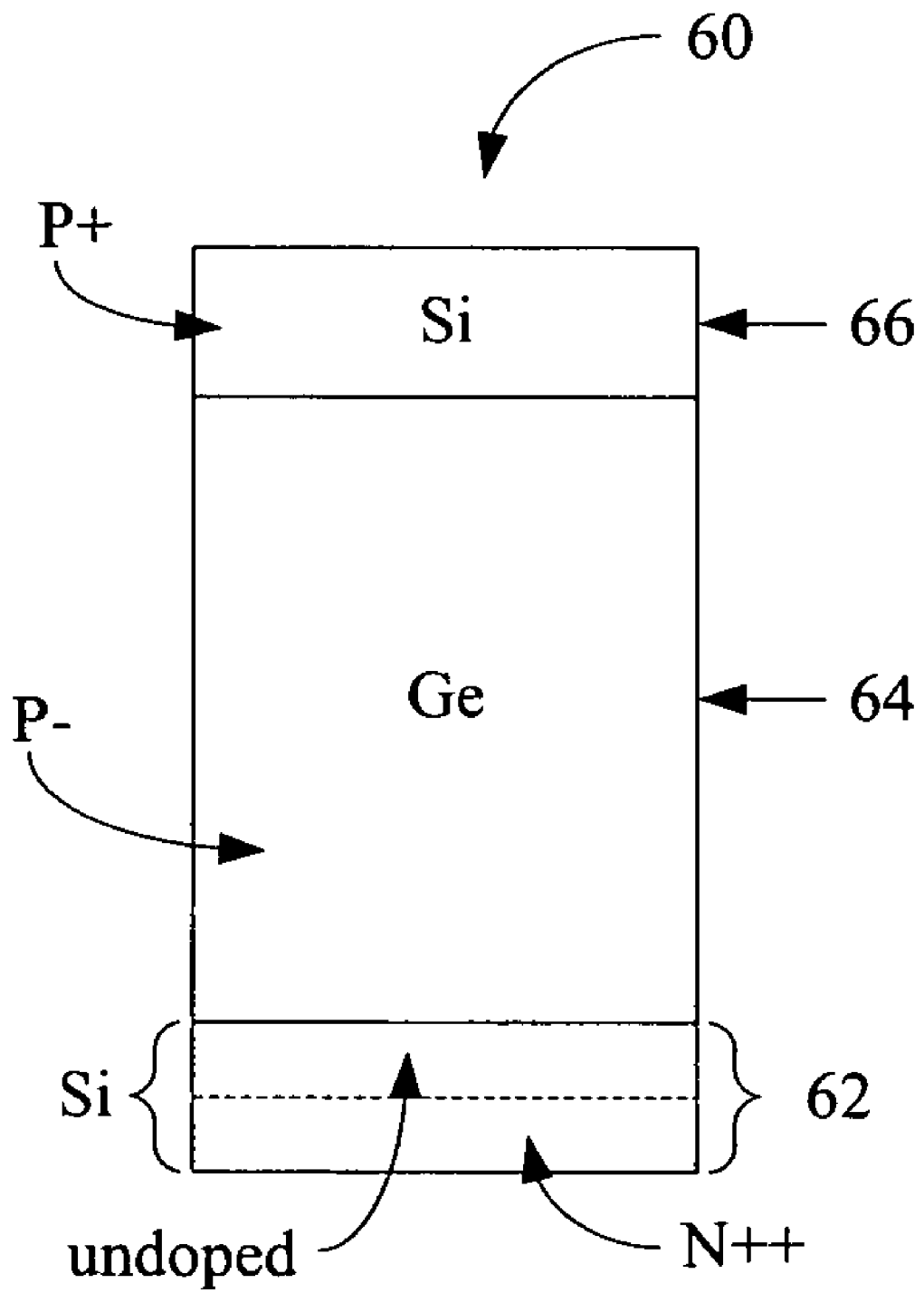

It has been noted that diffusion of n-type dopants is faster in germanium than in silicon. Thus there is a danger that dopants from a predominantly silicon heavily n-doped region will diffuse into an adjacent lightly doped or intrinsic region with a higher proportion of germanium, with potentially deleterious effect on device performance. Suppose, for example, junction diode 60 of FIG. 5f is ultimately to be a diode having a bottom heavily doped n-type region 62 of silicon about 400 angstroms thick, a middle lightly doped p-type region 64 of germanium about 2500 angstroms thick and a top heavily doped p-type region 66 of silicon about 200 angstroms thick. To prevent inadvertent dopant diffusion from the bottom heavily n-doped silicon region into the adjacent middle lightly doped p-type germanium region 64, it may be advantageous to dope, for example, the bottom 200 angstroms of region 62 very heavily (indicated as N++ in FIG. 5f), for example at a dopant concentration of between about $2\times10^{19}$ to about $4\times10^{21}$ atoms/cm$^3$, preferably about $1\times10^{21}$ atoms/cm$^3$. The remaining 200 angstroms of region 62 is undoped silicon as deposited. Next middle region 64 is formed, in this example of germanium, also undoped. Top region 66 is formed of undoped silicon. After pattern, etch, fill, and planarization, top region 66 is heavily doped with p-type dopants using ion implantation. Alternatively, top region 66 could have been in situ doped with p-type dopants during deposition.

Subsequent thermal processing will cause the n-type dopant atoms in the lower 100 angstroms of bottom region 62 to diffuse upward. The 100 angstroms of undoped silicon immediately above acts as a buffer zone into which these dopants can diffuse slowly before reaching the germanium of region 64.

In the embodiments described so far, each of the three regions of the junction diode (as defined by dopant level) has a distinct composition. Since silicon and germanium are fully miscible, however, it is possible, and in some instances may be advantageous, to gradually change semiconductor proportions across a section of the pillars, for example by gradually changing gas flows. For example, the junction diodes of the present invention can be formed by i) depositing silicon by flowing a first source gas comprising silicon for a first time period, ii) depositing germanium by flowing a second source gas comprising germanium for a second time period, wherein the first and second time periods overlap, and wherein, during at least a portion of the depositing steps, the flow of the first source gas is steadily increased or steadily decreased relative to the flow of the second source gas or the flow of the second source gas is steadily increased or decreased relative to the flow of the first source gas.

For example, a junction diode could be formed having a composition which is silicon at the bottom of its bottom heavily doped region. The proportion of germanium to silicon gradually rises into the lightly doped or intrinsic middle region, which could be, for example, 80 at % germanium and 20 at % silicon. The proportion of germanium to silicon could then gradually fall into the heavily doped top region, which could be silicon at its top.

An example will be given of how to form a junction diode grading from a region that is predominantly silicon to a region that is predominantly germanium. In the first region, a first proportion of a first source gas comprising silicon (SiH$_4$, Si$_2$H$_6$, or any other appropriate source gas) is flowed. A smaller proportion of a second source gas comprising germanium (GeH$_4$ or any other appropriate source gas) is flowed as well. Over a time period, the relative proportions of the gases are gradually changed, such that the first source gas is decreased and the second source gas is increased. The silicon:germanium ratio in the deposited semiconductor alloy will decrease steadily during this deposition.

Other materials can also be combined with silicon and germanium alloys, including carbon and tin. Both carbon and tin can be alloyed with silicon and germanium to alter the conductivity, carrier mobility, band gap, and other properties of the resulting alloy as desired. The percentage of carbon must be kept low enough to avoid formation of silicon carbide, however, which has a different crystal structure. Any of the junctions diodes having varied semiconductor composition so far described can comprise some proportion of carbon, tin, or both, as appropriate.

Clearly endless variations are possible; the examples here are provided for clarity and are not in any way intended to be limiting. A semiconductor junction diode falls within the scope of the invention so long as the entire junction diode is formed of semiconductor material and the semiconductor composition is not constant over the entire junction diode.

To summarize, preferred embodiments of the present invention provide for a method for forming a monolithic three dimensional memory array, the method comprising a) forming semiconductor pillars, the pillars comprising silicon and germanium, each pillar comprising i) a first heavily doped region having a first ratio of silicon to germanium; ii) a second region above the first heavily doped region having a second ratio of silicon to germanium; and iii) a third heavily doped region above the second region having a third ratio of silicon to germanium; and b) forming dielectric rupture antifuses above the semiconductor pillars, wherein the first, second and third ratios are not all the same.

Lee, U.S. patent application Ser. No. 10/077,108, "Diverse Band Gap Energy Level Semiconductor Device," filed Feb. 15, 2002 and assigned to the assignee of the present invention, discloses a p/n heterojunction diode comprising different semiconductor materials. All pillar embodiments of Lee, however, disclose a semiconductor stack which includes a bottom heavily doped layer having a first conductivity type, a second lightly doped layer having a second conductivity type opposite the first conductivity type, and a silicon dioxide dielectric rupture antifuse layer formed on the lightly doped layer. A heavily doped layer of the second conductivity type is formed on the silicon dioxide layer.

Thus a memory cell formed according to the present invention comprises a bottom conductor extending in a first direction; a polycrystalline or amorphous semiconductor junction diode over the bottom conductor, the junction diode comprising silicon and germanium, wherein the silicon: germanium ratio is not constant throughout the junction diode; a top conductor over the junction diode, the top conductor extending in a second direction different from the first direction; and a dielectric rupture antifuse layer in contact with the bottom conductor or the top conductor. This is in contrast with the cell of Lee, in which the antifuse is between the middle and the top semiconductor regions.

Monolithic three dimensional memory arrays are described in Johnson et al., U.S. Pat. No. 6,034,882, "Vertically stacked field programmable nonvolatile memory and method of fabrication"; Johnson, U.S. Pat. No. 6,525,953, "Vertically stacked field programmable nonvolatile memory and method of fabrication"; Knall et al., U.S. Pat. No. 6,420,215, "Three Dimensional Memory Array and Method of Fabrication"; Lee et al., U.S. patent application Ser. No. 09/927,648, "Dense Arrays and Charge Storage Devices, and Methods for Making Same," filed Aug. 13, 2001; Herner, U.S. application Ser. No. 10/095,962, "Silicide-Silicon Oxide-Semiconductor Antifuse Device and Method of Making," filed Mar. 13, 2002; Vyvoda et al., U.S. patent application Ser. No. 10/185,507, "Electrically Isolated Pillars in Active Devices," filed Jun. 27, 2002; Walker et al., U.S. application Ser. No. 10/335,089, "Method for Fabricating Programmable Memory Array Structures Incorporating Series-Connected Transistor Strings," filed Dec. 31, 2002; Scheuerlein et al., U.S. application Ser. No. 10/335,078, "Programmable Memory Array Structure Incorporating Series-Connected Transistor Strings and Methods for Fabrication and Operation of Same," filed Dec. 31, 2002; Vyvoda, U.S. patent application Ser. No. 10/440,882, "Rail Schottky Device and Method of Making", filed May 19, 2003; and Cleeves et al., "Optimization of Critical Dimensions and Pitch of Patterned Features in and Above a Substrate," U.S. patent application Ser. No. 10/728,451, filed Dec. 5, 2003, all assigned to the assignee of the present invention and hereby incorporated by reference.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

The present invention has been described herein in the context of a monolithic three dimensional memory array formed above a substrate. Such an array comprises at least a first memory level formed at a first height above the substrate and a second memory level formed at a second height different from the first height. Three, four, eight, or more memory levels can be formed above the substrate in such a multilevel array.

As appropriate, the methods and devices of the present invention can be used in any of the monolithic three dimensional memory arrays described in any of the incorporated references, including the '470 and the '230 applications.

Detailed methods of fabrication have been described herein, but any other methods that form the same structures can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A memory cell comprising a semiconductor pillar, the pillar comprising:
    a heavily doped bottom region of a first conductivity type;
    a heavily doped top region of a second conductivity type; and
    a lightly doped or intrinsic middle region interposed between and contacting the top and bottom regions,
    wherein the middle region comprises a first proportion of germanium and either the top region or the bottom region comprises no germanium or comprises a second proportion of germanium less then the first proportion.

2. The memory cell of claim 1 wherein the top, middle, and bottom regions form a junction diode.

3. The memory cell of claim 1 wherein the top region comprises a second proportion of germanium less than the first proportion of germanium.

4. The memory cell of claim 1 wherein the top region comprises no germanium.

5. The memory cell of claim 1 wherein the bottom region comprises a second proportion of germanium less than the first proportion of germanium.

6. The memory cell of claim 1 wherein the bottom region comprises no germanium.

7. The memory cell of claim 1 further comprising a dielectric rupture antifuse layer in contact with and above the top region.

8. The memory cell of claim 7 further comprising a top conductor above the dielectric rupture antifuse layer.

9. The memory cell of claim 8 wherein the top conductor comprises tungsten.

10. The memory cell of claim 7 wherein the dielectric rupture antifuse layer comprises silicon dioxide.

11. The memory cell of claim 7 wherein the dielectric rupture antifuse layer is grown on the semiconductor junction diode.

12. A memory cell comprising:
    a) a first conductor extending in a first direction;
    b) a second conductor extending in a second direction different from the first direction; and
    c) a semiconductor pillar vertically disposed between the first conductor and the second conductor, the pillar comprising:
        i) a bottom heavily doped region of a first conductivity type;
        ii) a top heavily doped region of a second conductivity type; and
        iii) a middle intrinsic or lightly doped region interposed between and in contact with the top and bottom regions,
            wherein the top region comprises a first proportion of silicon and the middle region or bottom region comprises either no silicon or a second proportion of silicon less then the first proportion.

13. The memory cell of claim 12 wherein the middle region comprises no silicon.

14. The memory cell of claim 13 wherein the middle region comprises germanium.

15. The memory cell of claim 12 wherein the middle region comprises carbon.

16. The memory cell of claim 12 wherein a dielectric rupture antifuse layer is grown on the top region.

17. The memory cell of claim 16 wherein the dielectric rupture antifuse layer is thermally grown.

18. The memory cell of claim 12 wherein at least one of the conductors comprises tungsten.

19. The memory cell of claim 12 wherein the first proportion of silicon is at least 80 atomic percent.

20. A method for forming a monolithic three dimensional memory array, the method comprising:
   a) forming semiconductor pillars, the pillars comprising silicon and germanium, each pillar comprising:
      i) a first heavily doped region having a first ratio of silicon to germanium;
      ii) a second region above the first heavily doped region having a second ratio of silicon to germanium; and
      iii) a third heavily doped region above the second region having a third ratio of silicon to germanium; and
   b) forming dielectric rupture antifuses above the semiconductor pillars, wherein the first, second and third ratios are not all the same.

21. The method of claim 20 wherein the first ratio is higher than the second ratio.

22. The method of claim 20 wherein the third ratio is higher than the second ratio.

23. The method of claim 20 wherein the first region is in situ doped.

24. The method of claim 20 wherein the third region is doped by ion implantation.

25. The method of claim 20 further comprising forming first conductors below the semiconductor pillars.

26. The method of claim 25 wherein the step of forming the first conductors comprises:
   depositing conductive material;
   patterning and etching the conductive material to form the first conductors;
   depositing first dielectric fill over and between the first conductors; and
   planarizing the first dielectric fill to expose the tops of the first conductors.

27. The method of claim 26 wherein the step of forming the semiconductor pillars comprises:
   depositing semiconductor material comprising silicon and germanium;
   patterning and etching the semiconductor material to form the pillars;
   forming second dielectric fill over and between the pillars; and
   planarizing the second dielectric fill to expose the tops of the pillars.

28. The method of claim 26 wherein the step of forming dielectric rupture antifuses comprises growing a dielectric layer on the tops of pillars.

29. The method of claim 28 wherein the dielectric layer comprises silicon dioxide.

30. The method of claim 28 wherein the dielectric layer comprises silicon nitride.

31. The method of claim 28 wherein the dielectric layer comprises silicon oxynitride.

32. A method for forming a memory cell, the method comprising:
   forming a first heavily doped semiconductor region;
   forming a second lightly doped or intrinsic semiconductor region on and in contact with the first semiconductor region; and
   forming a third heavily doped semiconductor region on and in contact with the second semiconductor region, wherein all three regions are polycrystalline or amorphous, and
   wherein the second region comprises a higher proportion of germanium than the first region.

33. The method of claim 32 wherein the first region comprises no germanium.

34. The method of claim 32 wherein the first region is in situ doped.

35. The method of claim 32 wherein the first region is doped with n-type dopants.

36. The method of claim 35 wherein the third region is doped with p-type dopants.

37. The method of claim 32 wherein the first region is doped with p-type dopants.

38. The method of claim 37 wherein the third region is doped with n-type dopants.

39. The method of claim 32 further comprising growing a dielectric rupture antifuse layer on the third region.

40. The method of claim 32 further comprising forming a bottom conductor below the first region.

41. The method of claim 40 further comprising forming a top conductor above the third region.

42. The method of claim 41 wherein the bottom or the top conductor comprises a metal.

43. The method of claim 42 wherein the metal comprises tungsten.

44. A method for forming a monolithic three dimensional memory array, the method comprising:
   a) forming substantially parallel first conductors extending in a first direction;
   b) forming first semiconductor pillars by
      i) depositing silicon by flowing a first source gas comprising silicon for a first time period;
      ii) depositing germanium by flowing a second source gas comprising germanium for a second time period, wherein the first and second time periods overlap, and wherein, during at least a portion of the depositing steps, the flow of the first source gas is steadily increased or steadily decreased relative to the flow of the second source gas or the flow of the second source gas is steadily increased or decreased relative to the flow of the first source gas; and
      iii) patterning and etching the deposited silicon and germanium to form the semiconductor pillars.

45. The method of claim 44 wherein the first source gas is $SiH_4$.

46. The method of claim 44 wherein the first source gas is $Si_2H_6$.

47. The method of claim 44 wherein the second source gas is $GeH_4$.

48. The method of claim 44 wherein the step of forming the first conductors comprises:
   depositing a first conductive layer;
   patterning and etching the first conductive layer to form the first conductors;
   depositing a first dielectric fill between and over the first conductors;
   planarizing the first dielectric fill to expose tops of the first conductors.

49. The method of claim 44 further comprising forming top conductors over the dielectric antifuses, the top conductors extending in a second direction different from the first direction.

50. The method of claim 49 wherein the bottom conductors, semiconductor pillars, and top conductors form a first memory level.

51. The method of claim 50 further comprising monolithically forming at least one additional memory level above the first memory level.

52. A memory cell comprising a semiconductor pillar, the pillar comprising:

a heavily doped bottom region of a first conductivity type;
a heavily doped top region of a second conductivity type; and
a lightly doped intrinsic middle region interposed between and contacting the top and bottom regions,
wherein the middle region comprises a first proportion of germanium and the top region or bottom region either comprises no germanium or comprises a second proportion of germanium less then the first proportion.

53. The memory cell of claim 52 further comprising a top conductor above the pillar.

54. The memory cell of claim 53 wherein the top conductor comprises tungsten.

55. The memory cell of claim 52 wherein the top, middle, and bottom regions comprise a junction diode.

56. The memory cell of claim 52 wherein the top region comprises a second proportion of germanium less than the first proportion of germanium.

57. The memory cell of claim 52 wherein the top region comprises no germanium.

58. The memory cell of claim 52 wherein the bottom region comprises a second proportion of germanium less than the first proportion of germanium.

59. The memory cell of claim 52 wherein the bottom region comprises no germanium.

60. The memory cell of claim 52 further comprising a dielectric rupture antifuse layer wherein the dielectric rupture antifuse layer is in contact with and above the top region.

61. The memory cell of claim 60 wherein the dielectric rupture antifuse layer comprises silicon dioxide.

62. The memory cell of claim 60 wherein the dielectric rupture antifuse layer is grown on the semiconductor junction diode.

63. A memory cell comprising:
a bottom conductor extending in a first direction;
a polycrystalline or amorphous semiconductor junction diode over the bottom conductor, the junction diode comprising silicon and germanium, wherein the silicon:germanium ratio is not constant throughout the junction diode;
a top conductor over the junction diode, the top conductor extending in a second direction different from the first direction; and
a dielectric rupture antifuse layer in contact with the bottom conductor or the top conductor.

64. The memory cell of claim 63 wherein a dielectric rupture antifuse is in contact with and below the top conductor.

65. The memory cell of claim 63 wherein the diode comprises:
a first heavily doped region;
a second region formed on and in contact with the first region; and
a third heavily doped region formed on and in contact with the second region.

66. The memory cell of claim 65 wherein the silicon:germanium ratio of the second region is less than the silicon:germanium ratio of the first region.

67. The memory cell of claim 66 wherein the first region is doped with p-type dopants.

68. The memory cell of claim 66 wherein the first region is doped with n-type dopants.

69. The memory cell of claim 66 wherein the second region is lightly doped or intrinsic.

70. The memory cell of claim 65 wherein the silicon:germanium ratio of the second region is less than the silicon:germanium ratio of the third region.

71. The memory cell of claim 65 wherein the dielectric rupture antifuse layer comprises silicon dioxide.

72. The memory cell of claim 65 wherein the dielectric rupture antifuse layer comprises silicon nitride.

73. The memory cell of claim 65 wherein the dielectric rupture antifuse layer comprises silicon oxynitride.

74. The memory cell of claim 65 wherein the dielectric rupture antifuse layer is grown on the semiconductor junction diode.

75. The memory cell of claim 65 wherein at least the top or the bottom conductor comprises a metal.

76. The memory cell of claim 75 wherein at least the top or the bottom conductor comprises tungsten.

77. The memory cell of claim 63 wherein at least the top or the bottom conductor comprises titanium nitride.

78. A memory cell comprising a semiconductor pillar, the pillar comprising:
a heavily doped bottom region of a first conductivity type;
a heavily doped top region of a second conductivity type;
a lightly doped or intrinsic middle region interposed between and contacting the top and bottom regions; and
a dielectric rupture antifuse layer in contact with and above the top region or in contact with and below the bottom region;
wherein the middle region comprises a first proportion of germanium and the top region or bottom region either comprises no germanium or comprises a second proportion of germanium less then the first proportion.

79. The memory cell of claim 78 wherein the dielectric rupture antifuse layer is in contact with and above the top region.

80. The memory cell of claim 79 farther comprising a top conductor above the dielectric rupture antifuse layer.

81. The memory cell of claim 80 wherein the top conductor comprises tungsten.

82. The memory cell of claim 78 wherein the top, middle, and bottom regions comprise a junction diode.

83. The memory cell of claim 78 wherein the top region comprises a second proportion of germanium less than the first proportion of germanium.

84. The memory cell of claim 78 wherein the top region comprises no germanium.

85. The memory cell of claim 78 wherein the bottom region comprises a second proportion of germanium less than the first proportion of germanium.

86. The memory cell of claim 78 wherein the bottom region comprises no germanium.

87. The memory cell of claim 78 wherein the dielectric rupture antifuse layer comprises silicon dioxide.

88. The memory cell of claim 78 wherein the dielectric rupture antifuse layer is grown on the semiconductor junction diode.

* * * * *

UNITED STATES PATENT AND TRADEMARK OFFICE
CERTIFICATE OF CORRECTION

PATENT NO.       : 7,224,013 B2                                          Page 1 of 1
APPLICATION NO.  : 10/954577
DATED            : May 29, 2007
INVENTOR(S)      : S. Brad Herner and Andrew J. Walker It is certified that error appears in the above-identified patent and that said Letters Patent is hereby corrected as shown below:

Column 16, line 39, "farther" should be changed to --further--.

Signed and Sealed this

Twentieth Day of November, 2007

JON W. DUDAS
*Director of the United States Patent and Trademark Office*